(12) United States Patent
Kho (10) Patent No.: US 10,178,791 B1
(45) Date of Patent: Jan. 8, 2019

(54) APPARATUS, SYSTEM, AND METHOD FOR SECURING COMPUTING COMPONENTS TO PRINTED CIRCUIT BOARDS

(71) Applicant: Facebook, Inc., Menlo Park, CA (US)

(72) Inventor: Chuankeat Kho, San Jose, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 15/713,607

(22) Filed: Sep. 23, 2017

(51) Int. Cl.
*H05K 7/14* (2006.01)
*H05K 1/02* (2006.01)

(52) U.S. Cl.
CPC ............ *H05K 7/1487* (2013.01); *H05K 1/02* (2013.01); *H05K 7/1488* (2013.01); *H05K 2201/10265* (2013.01); *H05K 2201/10393* (2013.01)

(58) Field of Classification Search
None
See application file for complete search history.

(56) References Cited

U.S. PATENT DOCUMENTS

| | | | | |
|---|---|---|---|---|
| 3,996,500 | A * | 12/1976 | Coules | H05K 7/12 174/138 D |
| D294,800 | S * | 3/1988 | Nilsson | D8/395 |
| 4,969,065 | A * | 11/1990 | Petri | F16B 5/0233 174/138 D |
| 5,281,149 | A * | 1/1994 | Petri | H05K 7/142 174/138 D |
| 5,724,803 | A | 3/1998 | Pea | |
| 5,793,614 | A | 8/1998 | Tollbom | |
| 5,957,659 | A | 9/1999 | Amou | |
| 6,109,767 | A | 8/2000 | Rodriguez | |
| 6,116,375 | A | 9/2000 | Lorch | |
| 6,159,031 | A * | 12/2000 | Llapitan | H01R 13/6275 439/326 |
| 6,181,549 | B1 | 1/2001 | Mills | |
| 6,404,646 | B1 * | 6/2002 | Tsai | G06F 1/184 174/138 G |
| 6,469,899 | B2 | 10/2002 | Hastings | |
| 6,621,692 | B1 | 9/2003 | Johnson | |
| 6,791,843 | B1 * | 9/2004 | Dobbs | H01R 13/62933 361/740 |
| 6,798,669 | B1 * | 9/2004 | Hsu | G06F 1/184 361/726 |
| 6,813,165 | B2 * | 11/2004 | Cheng | H05K 7/142 361/726 |

(Continued)

OTHER PUBLICATIONS

Acoustic Attenuation; https://en.wikipedia.org/wiki/Acoustic_attenuation; Oct. 22, 2012.

(Continued)

*Primary Examiner* — Xanthia C Cunningham
(74) *Attorney, Agent, or Firm* — FisherBroyles, LLP (57) ABSTRACT

A latch apparatus may include an L-shaped latch coupled to a frame such that a proximal end of the L-shaped latch secures a computing component to a printed circuit board. The latch apparatus may also include a pivot point coupled to a bend of the L-shaped latch to facilitate a rotation of the L-shaped latch around the pivot point within the frame. In addition, the latch apparatus may include a spring coupled to the frame to exert a force on the rotation of the L-shaped latch toward a locked position. Various other apparatuses, systems, and methods are also disclosed.

20 Claims, 7 Drawing Sheets

(56) References Cited

U.S. PATENT DOCUMENTS

| | | | | |
|---|---|---|---|---|
| 6,995,982 | B2* | 2/2006 | Gonzalez | G06F 1/184 |
| | | | | 361/742 |
| 7,004,764 | B2* | 2/2006 | Boudreau | H05K 7/142 |
| | | | | 174/138 G |
| 7,084,654 | B2* | 8/2006 | Zhao | G11B 5/4826 |
| | | | | 324/754.03 |
| 7,167,371 | B2 | 1/2007 | Coles | |
| 7,301,778 | B1 | 11/2007 | Fang | |
| 7,505,286 | B2* | 3/2009 | Brovald | H05K 7/1417 |
| | | | | 174/138 E |
| 7,515,413 | B1 | 4/2009 | Curtis | |
| 7,649,750 | B2* | 1/2010 | Lee | H05K 7/1405 |
| | | | | 361/732 |
| 8,020,902 | B1* | 9/2011 | Li | E05C 19/06 |
| | | | | 292/303 |
| 8,310,828 | B2 | 11/2012 | Collins | |
| 8,570,720 | B2* | 10/2013 | Yao | G06F 13/409 |
| | | | | 361/679.02 |
| 8,657,619 | B2* | 2/2014 | Lin | G06F 1/185 |
| | | | | 439/326 |
| 8,749,966 | B1 | 6/2014 | Boudreau | |
| 8,848,349 | B2* | 9/2014 | Ke | H05K 5/02 |
| | | | | 361/679.01 |
| 8,944,538 | B2 | 2/2015 | Li | |
| 8,971,052 | B2* | 3/2015 | Fu | G06F 1/185 |
| | | | | 361/679.32 |
| 9,066,438 | B2* | 6/2015 | Chen | H05K 7/1405 |
| 9,070,419 | B1 | 6/2015 | Zhu | |
| 9,098,233 | B2 | 8/2015 | Keffeler | |
| 9,101,210 | B2 | 8/2015 | Lin | |
| 9,203,188 | B1 | 12/2015 | Siechen | |
| 9,354,003 | B2* | 5/2016 | Lin | F28F 99/00 |
| 9,456,519 | B2* | 9/2016 | Bailey | H05K 7/1488 |
| 9,461,389 | B2 | 10/2016 | Novack | |
| 9,538,684 | B2 | 1/2017 | Chen | |
| 9,545,028 | B2 | 1/2017 | Hoshino | |
| 9,572,276 | B2 | 2/2017 | Haroun | |
| 9,583,877 | B1 | 2/2017 | Angelucci | |
| 9,609,778 | B1 | 3/2017 | Spencer | |
| 9,763,350 | B2 | 9/2017 | Rust | |
| 9,795,052 | B2 | 10/2017 | Hsiao | |
| 2005/0238421 | A1 | 10/2005 | Doerr | |
| 2006/0134953 | A1 | 6/2006 | Williams | |
| 2006/0274508 | A1 | 12/2006 | LaRiviere | |
| 2007/0230111 | A1 | 10/2007 | Starr | |
| 2008/0117569 | A1 | 5/2008 | Lee | |
| 2009/0245745 | A1 | 10/2009 | Krampotich | |
| 2009/0271950 | A1 | 11/2009 | Wang | |
| 2009/0274429 | A1 | 11/2009 | Krampotich | |
| 2009/0310303 | A1 | 12/2009 | Najbert | |
| 2010/0195304 | A1* | 8/2010 | Takao | G06F 1/1616 |
| | | | | 361/804 |
| 2010/0296791 | A1 | 11/2010 | Makrides-Saravanos | |
| 2011/0273850 | A1 | 11/2011 | Chen | |
| 2011/0309730 | A1 | 12/2011 | Retchloff | |
| 2012/0004772 | A1 | 1/2012 | Rahilly | |
| 2012/0020006 | A1 | 1/2012 | Xu | |
| 2012/0134086 | A1 | 5/2012 | Zhang | |
| 2012/0230815 | A1 | 9/2012 | Teramoto | |
| 2012/0257360 | A1* | 10/2012 | Sun | H01R 12/7052 |
| | | | | 361/748 |
| 2012/0305745 | A1 | 12/2012 | Chen | |
| 2013/0058054 | A1* | 3/2013 | Zhou | G06F 1/185 |
| | | | | 361/748 |
| 2013/0325183 | A1 | 12/2013 | Rahilly | |
| 2014/0111930 | A1* | 4/2014 | Henderson | G06F 1/181 |
| | | | | 361/679.31 |
| 2014/0187068 | A1 | 7/2014 | Chia | |
| 2014/0191636 | A1 | 7/2014 | Li | |
| 2014/0369002 | A1 | 12/2014 | Takeuchi | |
| 2015/0156912 | A1 | 6/2015 | Liang | |
| 2015/0163946 | A1 | 6/2015 | Kyle | |
| 2015/0208548 | A1 | 7/2015 | Chu | |
| 2015/0235673 | A1 | 8/2015 | Lo | |
| 2016/0150659 | A1 | 5/2016 | Chen | |
| 2016/0150667 | A1 | 5/2016 | Xu | |
| 2016/0330858 | A1 | 11/2016 | Ehlen | |

OTHER PUBLICATIONS

Electromagnetic Shielding; https://en.wikipedia.org/wiki/Electromagnetic_shielding; May 15, 2016.

Jason David Adrian et al.; Apparatus, System, and Method for Reconfigurable Media-Agnostic Storage; U.S. Appl. No. 15/694,068, filed Sep. 1, 2017.

Jason David Adrian; Apparatus, System, and Method for Indicating the Status of and Securing Hard Drives; U.S. Appl. No. 15/700,112, filed Sep. 9, 2017.

Jason David Adrian; Apparatus, System, and Method for Directing Air in a Storage-System Chassis; U.S. Appl. No. 15/689,650, filed Aug. 29, 2017.

Jason David Adrian et al.; Apparatus, System, and Method for Enabling Multiple Storage-System Configurations; U.S. Appl. No. 15/688,830, filed Aug. 28, 2017.

Jason David Adrian et al.; Apparatus, System, and Method for Securing Hard Drives in a Storage Chassis; U.S. Appl. No. 15/697,405, filed Sep. 6, 2017.

Jason David Adrian; Apparatus, System, and Method for Detecting Device Types of Storage Devices; U.S. Appl. No. 15/698,540, filed Sep. 7, 2017.

Chuankeat Kho et al.; Removeable Drive-Plane Apparatus, System, and Method; U.S. Appl. No. 15/693,362, filed Aug. 31, 2017.

Chuankeat Kho et al.; Systems and Methods for Mounting Assembly Pull-Handles; U.S. Appl. No. 15/687,406, filed Aug. 25, 2017.

Jason David Adrian; An Apparatus, System, and Method for Reconfiguring Air Flow Through a Chassis; U.S. Appl. No. 15/716,251, filed Sep. 26, 2017.

Jason Adrian; Introducing Bryce Canyon: Our next-generation storage platform; https://code.facebook.com/posts/1869788206569924/introducing-bryce-canyon-our-next-generation-storage-platform/; Mar. 8, 2017.

Jason Adrian et al.; Bryce Canyon Storage Specification; Jan. 31, 2017.

Open Compute Project; http://opencompute.org/; as accessed Sep. 29, 2017.

Jason David Adrian; Data-Center Drawer and Cable Track Assembly; U.S. Appl. No. 15/720,647, filed Sep. 29, 2017.

Bisson; How Facebook Does Storage; https://thenewstack.io/facebook-storage.

What's the Difference Between SATA and SAS Hard Drives?; https://www.pickaweb.co.uk/kb/difference-between-sata-sas-hard-drives/.

Chuankeat Kho et al.; Apparatus, System, and Method for Partitioning a Storage-System Chassis; U.S. Appl. No. 15/708,069, filed Sep. 18, 2017.

Chuankeat Kho et al.; Apparatus, System, and Method for Dampening Vibrations Generated by Exhaust Fans; U.S. Appl. No. 15/713,609, filed Sep. 23, 2017.

Chuankeat Kho et al.; Apparatus, System, and Method for Resisting Shock to a Data-Center Rack; U.S. Appl. No. 15/708,075, filed Sep. 18, 2017.

* cited by examiner

APPARATUS, SYSTEM, AND METHOD FOR SECURING COMPUTING COMPONENTS TO PRINTED CIRCUIT BOARDS

BACKGROUND

Data centers typically contain an abundance of various hardware that perform different computing functions for organizations and individuals. For example, a data center may contain racks that hold servers and databases to provide networked storage and processing capabilities. Many large data centers require a variety of computing components to operate efficiently, and such hardware may fail or become obsolete over time. Thus, hardware components often need to be easily mounted to or removed from the system.

However, some components may be difficult to access after they are installed in data-center racks. For example, components mounted to printed circuit boards are often hidden in recesses of data-center racks. Other components may require precise mounting to function in conjunction with a system of hardware parts. As in the above example, a network interface controller required to connect a server to a network may need to be paired with the printed circuit board of the server to function. Traditional methods may attempt to secure such components with mounting tools like screws or pins. Unfortunately, these mounting methods may break components or tools from regular usage, especially for parts that may need to be frequently swapped. Furthermore, particularly in large data centers, a large volume of hardware swapping may require quick and easy installation to save time and energy. For example, some data centers may automate certain tasks using machines and robots, and complex component mounting systems may be too difficult to automate. Therefore, improved methods to mount computing components to printed circuit boards are needed to overcome traditional disadvantages.

SUMMARY

As will be described in greater detail below, the instant disclosure describes various apparatuses, systems, and methods for securing computing components to printed circuit boards by locking the computing components in place with an L-shaped latch tensioned by a spring. In one example, a latch apparatus may include an L-shaped latch coupled to a frame such that a proximal end of the L-shaped latch secures a computing component to a printed circuit board. The apparatus may also include a pivot point coupled to a bend of the L-shaped latch to facilitate a rotation of the L-shaped latch around the pivot point within the frame. Additionally, the apparatus may include a spring coupled to the frame to exert a force on the rotation of the L-shaped latch toward a locked position.

In some embodiments, the frame may be coupled to the printed circuit board by an anchor. Additionally or alternatively, the frame may include a protruding part of the printed circuit board.

In some examples, the proximal end of the L-shaped latch may include a hook that surrounds a portion of the computing component to force the computing component toward the printed circuit board.

In one embodiment, the pivot point may facilitate the rotation of the L-shaped latch such that a position of the pivot point prohibits an unintentional rotation of the L-shaped latch. In this embodiment, the pivot point may also facilitate the rotation of the L-shaped latch such that a downward force on the proximal end of the L-shaped latch exerts an upward rotation of a distal end of the L-shaped latch. In this embodiment, the downward force on the proximal end of the L-shaped latch may rotate the distal end of the L-shaped latch to exert a force upward to lift the computing component away from the printed circuit board. Additionally, the pivot point may facilitate the rotation of the L-shaped latch such that a downward force on the distal end of the L-shaped latch exerts an upward rotation of the proximal end of the L-shaped latch. In this embodiment, a downward force applied to the computing component toward the distal end of the L-shaped latch may lock the L-shaped latch.

In some examples, the spring may be coupled to a pin inserted through the frame. Additionally, the spring may exert a force against a protrusion of the L-shaped latch to maintain the locked position of the L-shaped latch. In these examples, the protrusion may be extended from an outer surface of the L-shaped latch such that the protrusion slides past the spring as the L-shaped latch rotates around the pivot point.

According to various embodiments, a corresponding data-center rack may include a rack dimensioned to hold computer hardware and one or more chassis, coupled to the rack, that contains one or more printed circuit boards. Additionally, the data-center rack may include one or more computing components coupled to each printed circuit board. The data-center rack may also include one or more latch apparatuses coupled to the printed circuit board to secure each computing component to the printed circuit board.

In one example, a chassis may be dimensioned to slide perpendicular to a face of the rack such that the chassis extends away from the rack to expose the printed circuit board.

In one embodiment, a latch apparatus may include a frame, an L-shaped latch coupled to the frame, a pivot point coupled to a bend of the L-shaped latch, and a spring coupled to the frame. In this embodiment, a proximal end of the L-shaped latch may surround a portion of the computing component to force the computing component toward the chassis. Furthermore, in this embodiment, the pivot point may facilitate a rotation of the L-shaped latch such that a position of the pivot point prohibits an unintentional rotation of the L-shaped latch, a downward force on the proximal end of the L-shaped latch rotates a distal end of the L-shaped latch to exert a force upward to lift the computing component away from the chassis, and a downward force applied to the computing component toward the distal end of the L-shaped latch rotates the L-shaped latch toward a locked position.

In the above embodiment, the spring of the latch apparatus may be coupled to a pin inserted through the frame. Additionally, the spring may exert a force against a protrusion of the L-shaped latch to prevent a rotation of the L-shaped latch.

In addition to the various systems and apparatuses described herein, the instant disclosure presents exemplary methods for securing computing components to printed circuit boards. For example, a corresponding method may include coupling an L-shaped latch to a frame such that a proximal end of the L-shaped latch secures a computing component to a printed circuit board. The method may also include coupling a pivot point to a bend of the L-shaped latch to facilitate a rotation of the L-shaped latch around the pivot point within the frame. Additionally, the method may include coupling a spring to the frame to exert a force on the rotation of the L-shaped latch toward a locked position.

In some examples, the proximal end of the L-shaped latch in the above method may include a hook that surrounds a portion of the computing component to force the computing component toward the printed circuit board.

In some embodiments, coupling the pivot point to the bend of the L-shaped latch may include facilitating the rotation of the L-shaped latch such that a position of the pivot point prohibits an unintentional rotation of the L-shaped latch. In these embodiments, coupling the pivot point to the bend of the L-shaped latch may also include facilitating the rotation such that a downward force on the proximal end of the L-shaped latch exerts an upward rotation of a distal end of the L-shaped latch. Additionally, coupling the pivot point to the bend may also include facilitating the rotation of the L-shaped latch such that a downward force on the distal end of the L-shaped latch exerts an upward rotation of the proximal end of the L-shaped latch.

In one example, coupling the spring to the frame may include coupling the spring to a pin inserted through the frame and dimensioning the spring to exert a force against a protrusion of the L-shaped latch to maintain the locked position of the L-shaped latch. In further examples, the above method may include extending the protrusion from an outer surface of the L-shaped latch such that the protrusion slides past the spring as the L-shaped latch rotates around the pivot point.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes and illustrates various apparatuses, systems, and methods for securing computing components to printed circuit boards. As will be explained in greater detail below, embodiments of the instant disclosure may improve computing component mounting methods by coupling a latch to a printed circuit board for ease of mounting and dismounting. A spring may exert a force to keep the latch locked in place around a computing component. For example, the spring may create a tension against a protrusion of the latch to prevent the latch from rotating open. The latch may also unseat the computing component by lifting the computing component from the printed circuit board in the course of rotating to an open position. Additionally, the latch may be implemented as part of a data-center rack that holds printed circuit boards in a chassis. Thus, the embodiments described herein may facilitate easier and faster swapping of computing components on printed circuit boards for data centers.

Figure 1:
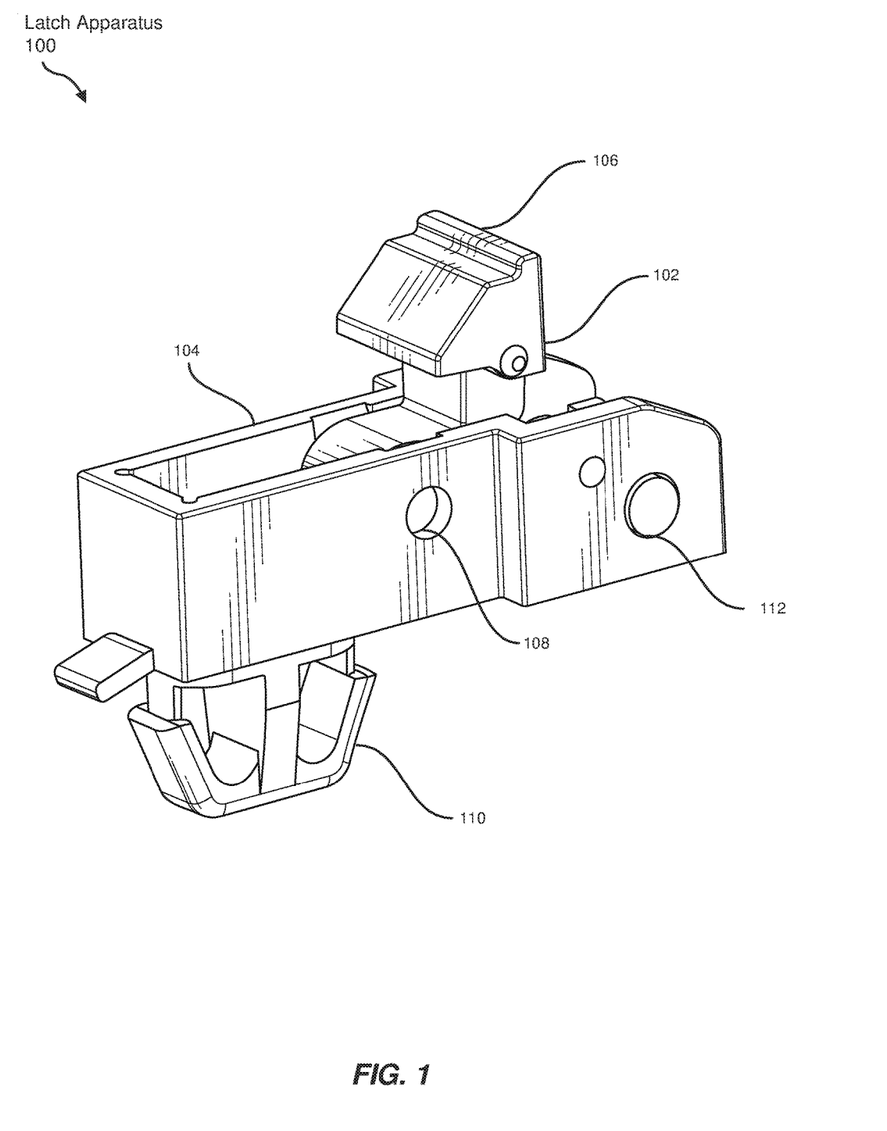
FIG. 1 is a perspective view of a latch apparatus for securing computing components to printed circuit boards in a locked position.
Figure 2:
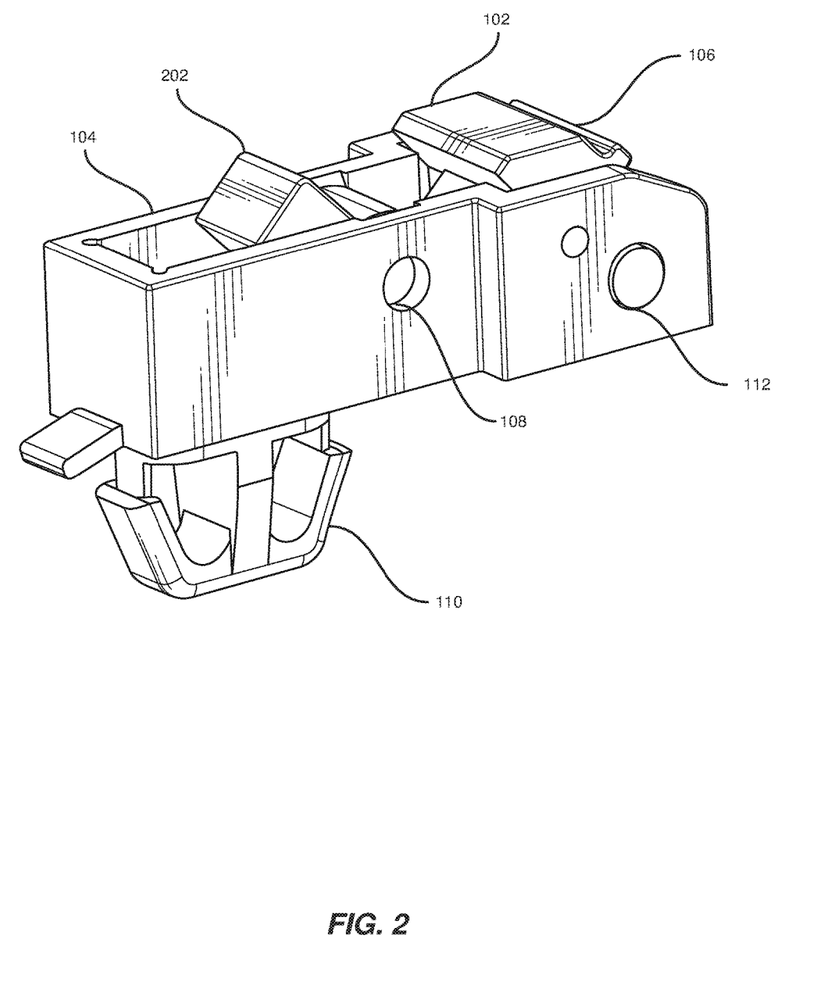
FIG. 2 is a perspective view of a latch apparatus for securing computing components to printed circuit boards in an unlocked position.
Figure 3:
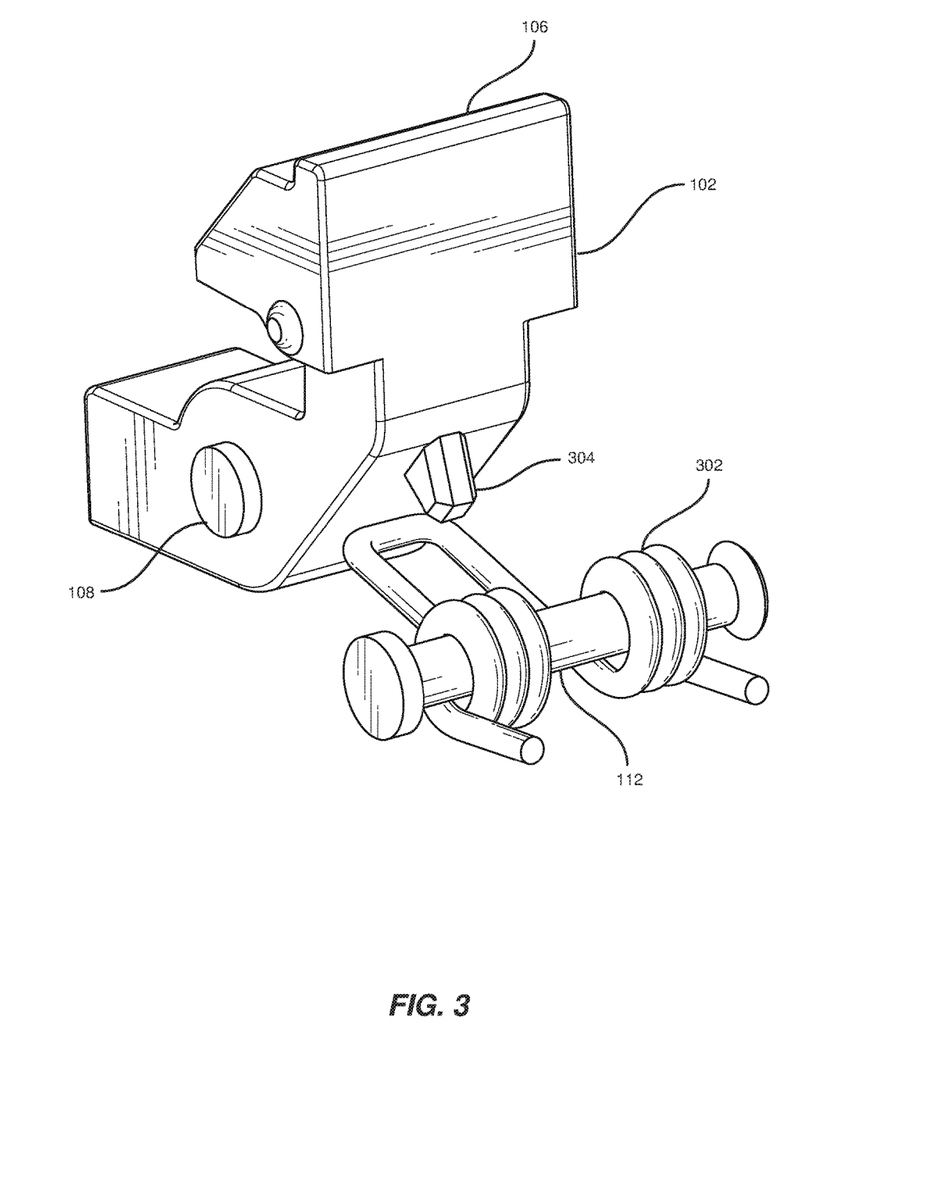
FIG. 3 is a perspective view of an L-shaped latch and a spring exerting a force on the L-shaped latch.

The following will provide, with reference to FIGS. 1-3, detailed descriptions of a latch apparatus. In addition, the discussion associated with FIGS. 4-5 will provide examples of the latch apparatus securing a computing component to and lifting the computing component from a printed circuit board. The discussion associated with FIG. 6 will provide an example of a data-center rack in which latch apparatuses may secure a computing component to a printed circuit board in a chassis. Finally, the discussion corresponding to FIG. 7 will provide example methods for manufacturing, assembling, configuring, and/or using the latch apparatuses presented herein.

FIG. 1 illustrates a perspective view of a latch apparatus 100 for securing computing components to printed circuit boards in a locked position. As used herein, the term "computing component" generally refers to an electronic hardware element that performs a distinct function. Examples of computing components may include, without limitation, data storage, a network interface controllers, graphics cards, sound cards, and/or any other suitable hardware component. The term "printed circuit board," as used herein, generally refers to a mechanical structure that provides electronic connections between electronic and computing components coupled to the structure.

In some examples, latch apparatus 100 may include an L-shaped latch 102 coupled to a frame 104 such that a proximal end 106 of L-shaped latch 102 secures a computing component to a printed circuit board. In these examples, latch apparatus 100 may also include a pivot point 108 coupled to a bend of L-shaped latch 102 to facilitate a rotation of L-shaped latch 102 around pivot point 108 within frame 104. Additionally, latch apparatus 100 may include a pin 112 that couples a spring to frame 104. Furthermore, frame 104 may include an anchor 110 to couple latch apparatus 100 to the printed circuit board.

In one embodiment, pivot point 108 may facilitate the rotation of L-shaped latch 102 such that a position of pivot point 108 prohibits an unintentional rotation of L-shaped latch 102. In this embodiment, pivot point 108 may also facilitate the rotation of L-shaped latch 102 such that a downward force on a distal end of L-shaped latch 102 exerts an upward rotation of proximal end 106 of L-shaped latch 102. For example, pivot point 108 may couple to a hole or groove in one side of frame 104 such that L-shaped latch 102 rotates around pivot point 108. In other examples, a second pivot point coupled to the other side of frame 104 may provide additional stability for L-shaped latch 102 during rotation in frame 104. As illustrated in FIG. 1, proximal end 106 may remain upright in the locked position when the distal end of L-shaped latch 102 remains in frame 104, and proximal end 106 may rotate to the upright position around pivot point 108 as the distal end rotates downward.

FIG. 2 illustrates a perspective view of latch apparatus 100 of FIG. 1 in an unlocked position. In one example, pivot point 108 may facilitate the rotation of L-shaped latch 102 such that a downward force on proximal end 106 of L-shaped latch 102 exerts an upward rotation of a distal end 202 of L-shaped latch 102. In this example, the downward force on proximal end 106 may rotate L-shaped latch 102 around pivot point 108 to force distal end 202 upward out of frame 104 to the unlocked position.

FIG. 3 is a perspective view of L-shaped latch 102 and a spring 302 that exerts a force on L-shaped latch 102. In some embodiments, spring 302 may be coupled to frame 104 of latch apparatus 100 in FIG. 1 to exert a force on the rotation of L-shaped latch 102 toward the locked position. In these embodiments, spring 302 may be biased to always exert force toward the locked position. A greater force may overcome the force of spring 302 to unlock latch apparatus 100.

In some examples, spring 302 may be coupled to pin 112 inserted through frame 104. Furthermore, spring 302 may exert a force against a protrusion 304 of L-shaped latch 102 to maintain the locked position of L-shaped latch 102. In these examples, an upward force of spring 302 against protrusion 304 may prevent a rotation of L-shaped latch 102 to the unlocked position. Additionally, protrusion 304 may be extended from an outer surface of L-shaped latch 102 such that protrusion 304 slides past spring 302 as L-shaped latch 102 rotates around pivot point 108. In these examples, protrusion 304 may be biased to easily slide upward past spring 302 to the locked position, such that proximal end 106 moves upright, and resist sliding downward past spring 302 to the unlocked position.

Figure 4:
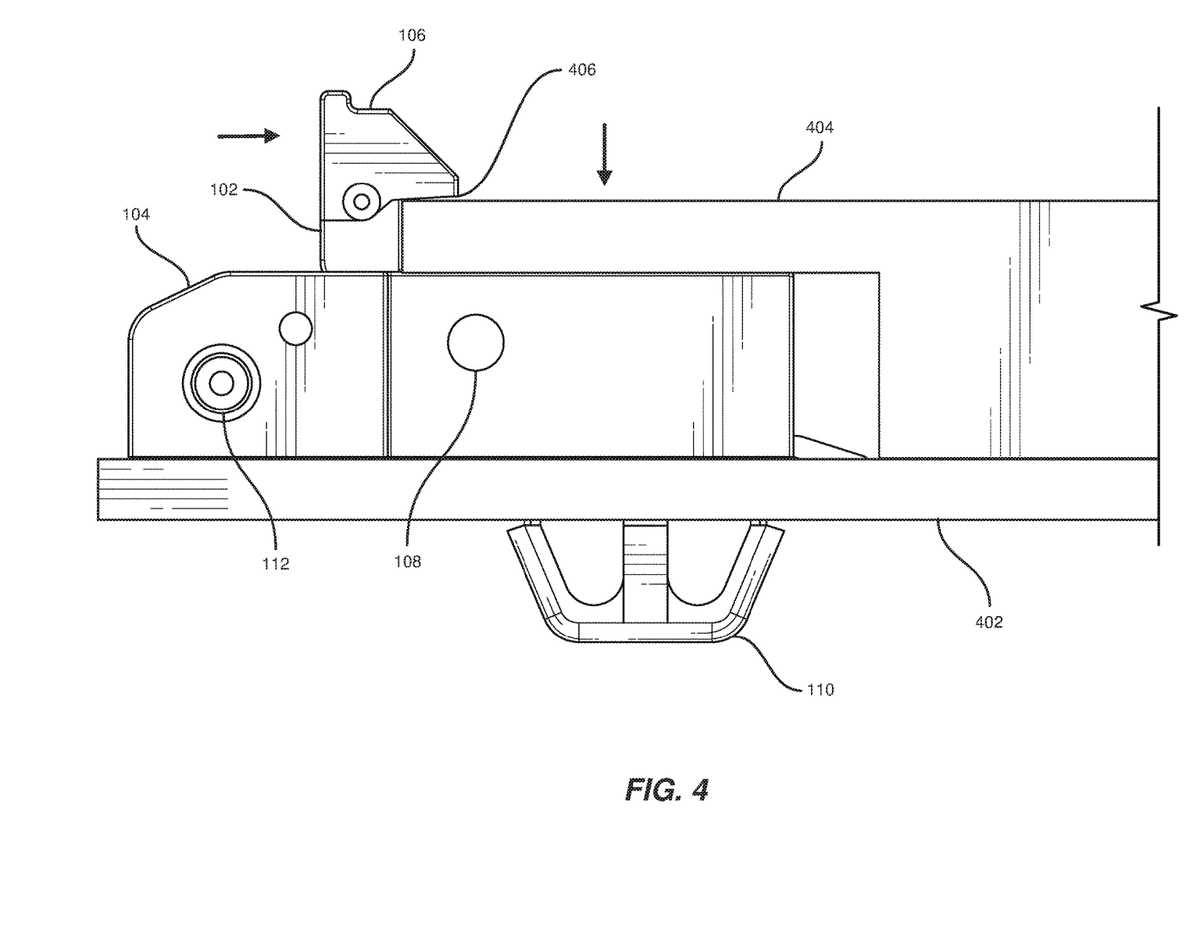
FIG. 4 is a side view of a computing component secured to a printed circuit board by a latch apparatus in a locked position.

FIG. 4 is a side view of a computing component 404 secured to a printed circuit board 402 by latch apparatus 100 in a locked position. In one embodiment, frame 104 may be coupled to printed circuit board 402 by anchor 110. In this embodiment, anchor 110 may be biased to pass through a hole in printed circuit board 402 and to resist removal from printed circuit board 402. In another embodiment, frame 104 may be a protruding part of printed circuit board 402 in a fixed position.

In some examples, proximal end 106 of L-shaped latch 102 may include a hook 406 that surrounds a portion of computing component 404 to force computing component 404 toward printed circuit board 402. Hook 406 may represent a protrusion from proximal end 106 fitted to a dimension of the portion of computing component 404 such that hook 406 secures the portion of computing component 404. In the example of FIG. 4, hook 406 may be fitted to a thickness of the portion of computing component 404.

In one example, computing component 404 may represent a network interface controller that includes a separate attached printed circuit board, and L-shaped latch 102 may surround a portion of the separate printed circuit board to mount the network interface controller to printed circuit board 402. Similarly, computing component 404 may fit into a specific position in a chassis that holds multiple printed circuit boards and/or components such that computing component 404 is coupled with printed circuit board 402 as latch apparatus 100 secures computing component 404 into the specific position. In this example, computing component 404 may couple to a portion of printed circuit board 402, such as the network interface controller sliding into a network card slot on printed circuit board 402.

As shown in FIG. 4, in some embodiments, a downward force applied to computing component 404 toward distal end 202 of L-shaped latch 102 may lock L-shaped latch 102. Additionally, the downward force applied to computing component 404 may convert to a downward force on distal end 202 of L-shaped latch 102. In these embodiments, pivot point 108 may facilitate a rotation of L-shaped latch 102 such that the downward force applied to computing component 404 toward distal end 202 of L-shaped latch 102 rotates L-shaped latch 102 toward a locked position. In other words, as the downward force rotates distal end 202 down to frame 104, proximal end 106 may be forced upward such that hook 406 locks onto computing component 404.

Additionally, in one embodiment, pivot point 108 may be positioned below the portion of computing component 404 locked by hook 406 such that pivot point 108 prevents L-shaped latch 102 from rotating open due to an unintentional upward force of computing component 404 by preventing rotation under the structure of computing component 404 while locked by hood 406. In this embodiment, the position of pivot point 108 may also enable the downward force applied to computing component 404 to facilitate the rotation of L-shaped latch 102 to an open position, due to force applied to slanted proximal end 106 of L-shaped latch 102, until the edge of computing component 404 moves past hook 406 to be locked by L-shaped latch 102. Thus, the position of pivot point 108 may prevent unintentional weak forces from moving L-shaped latch 102 while enabling stronger intentional forces to rotate L-shaped latch 102 to desired positions.

Figure 5:
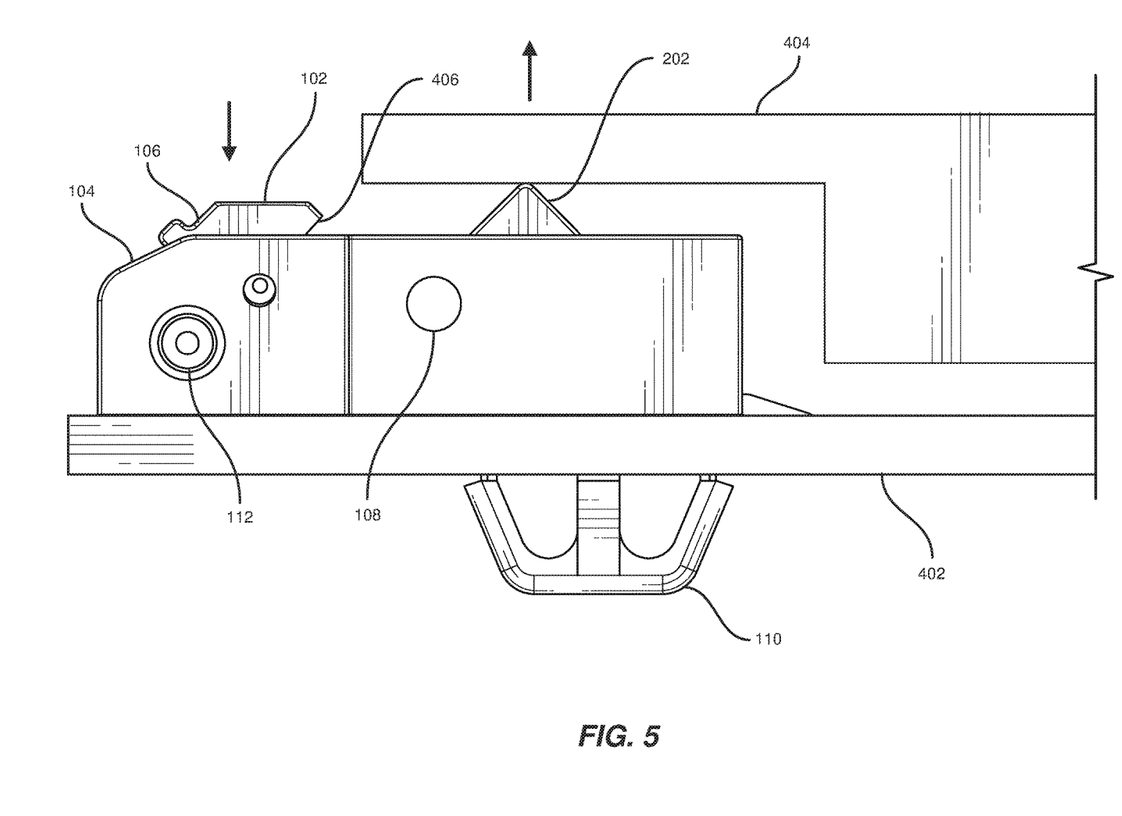
FIG. 5 is a side view of a computing component lifted away from a printed circuit board by a latch apparatus in an unlocked position.

FIG. 5 is a side view of computing component 404 lifted away from printed circuit board 402 by latch apparatus 100 in an unlocked position. In some examples, a downward force on proximal end 106 of L-shaped latch 102 may rotate distal end 202 of L-shaped latch 102 to exert a force upward to lift computing component 404 away from printed circuit board 402. In these examples, pivot point 108 may facilitate a rotation of L-shaped latch 102 such that the downward force on proximal end 106 rotates distal end 202 to exert a force upward to lift computing component 404 away from a chassis holding printed circuit board 402. Additionally, the downward force on proximal end 106 may be greater than the force exerted by spring 302 of FIG. 3 to overcome the force on the rotation of L-shaped latch 102 toward the locked position.

Figure 6:
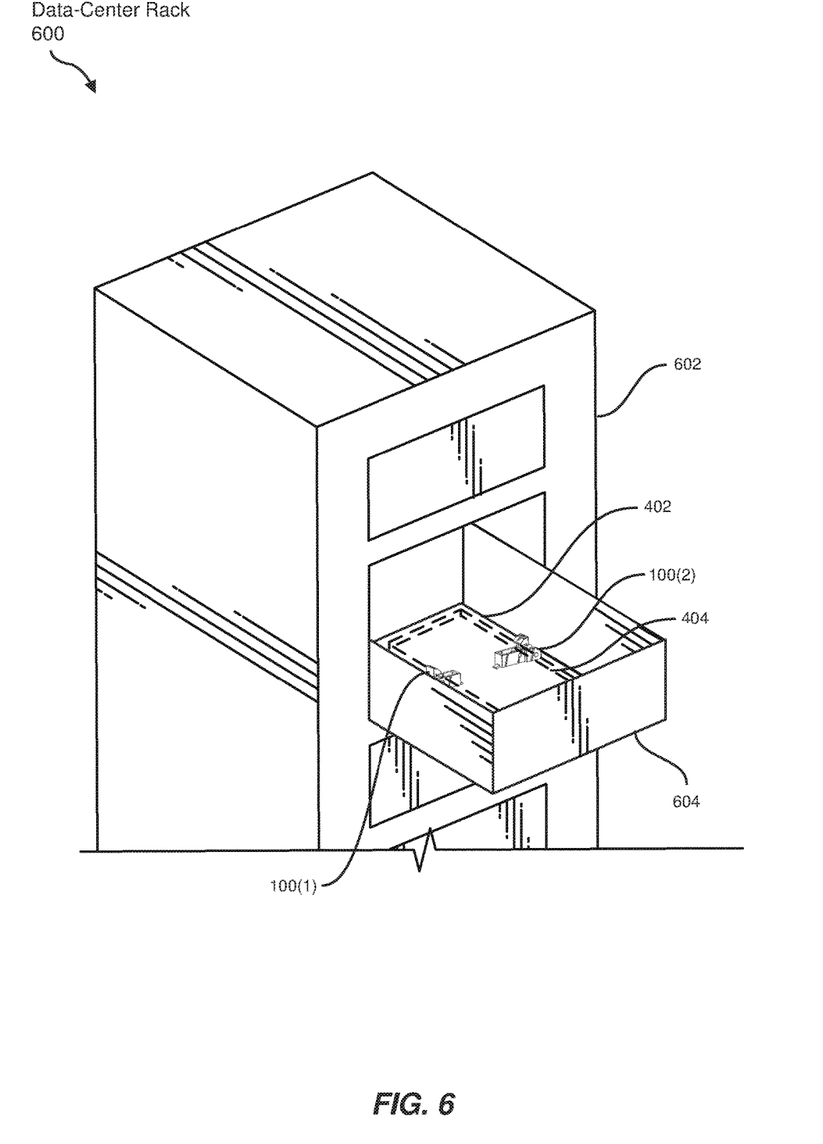
FIG. 6 is a perspective view of a data-center rack with a chassis exposing latch apparatuses securing a computing component to a printed circuit board.

FIG. 6 is a perspective view of a data-center rack 600 with a chassis 604 exposing latch apparatuses 100(1) and 100(2) securing computing component 404 to printed circuit board 402. As used herein, the term "data-center rack" generally refers to a physical framework designed to house electronic and/or computing equipment, particularly in a networked data center. The term "chassis," as used herein, generally refers to a base structure or framework that fits into a data-center rack, such as in a drawer-like fashion.

In one embodiment, data-center rack 600 may include a rack 602 dimensioned to hold computer hardware. In this embodiment, data-center rack 600 may also include chassis 604, coupled to rack 602, that contains printed circuit board 402. Additionally, data-center rack 600 may include computing component 404 coupled to printed circuit board 402 and latch apparatuses 100(1) and 100(2) coupled to printed circuit board 402 to secure computing component 404 to printed circuit board 402. Although illustrated with two latch apparatuses in FIG. 6, data-center rack 600 may include fewer or more latch apparatuses coupled to printed circuit board 402 in various configurations based on a size and/or a shape of computing component 404.

In some examples, chassis 604 may be dimensioned to slide perpendicular to a face of rack 602 such that chassis 604 extends away from rack 602 to expose printed circuit board 402. Additionally or alternatively, chassis 604 may include various doors and/or compartments that facilitate access to printed circuit board 402.

In some embodiments, the proximal ends of the L-shaped latches of latch apparatuses 100(1) and/or 100(2) may surround different portions of computing component 404 to simultaneously force computing component 404 toward chassis 604. Similar to the example of FIG. 4, the proximal end 106 of the L-shaped latch of latch apparatus 100(1) may surround a proximal section of computing component 404 to force computing component 404 toward printed circuit board 402. Similarly, latch apparatus 100(2) may exert a similar force on a distal section of computing component 404 to force computing component 404 toward printed circuit board 402.

In the above embodiments, to unseat and/or remove computing component 404 from printed circuit board 402, separate forces may be exerted to unlock latch apparatus 100(1) and latch apparatus 100(2), either simultaneously or in sequence. To install and/or mount computing component 404 to printed circuit board 402, a single downward force may be exerted on computing component 404 to lock latch apparatuses 100(1) and 100(2). Alternatively, separate downward forces on computing component 404 may be exerted near latch apparatus 100(1) and latch apparatus 100(2) to individually lock each latch apparatus.

Figure 7:
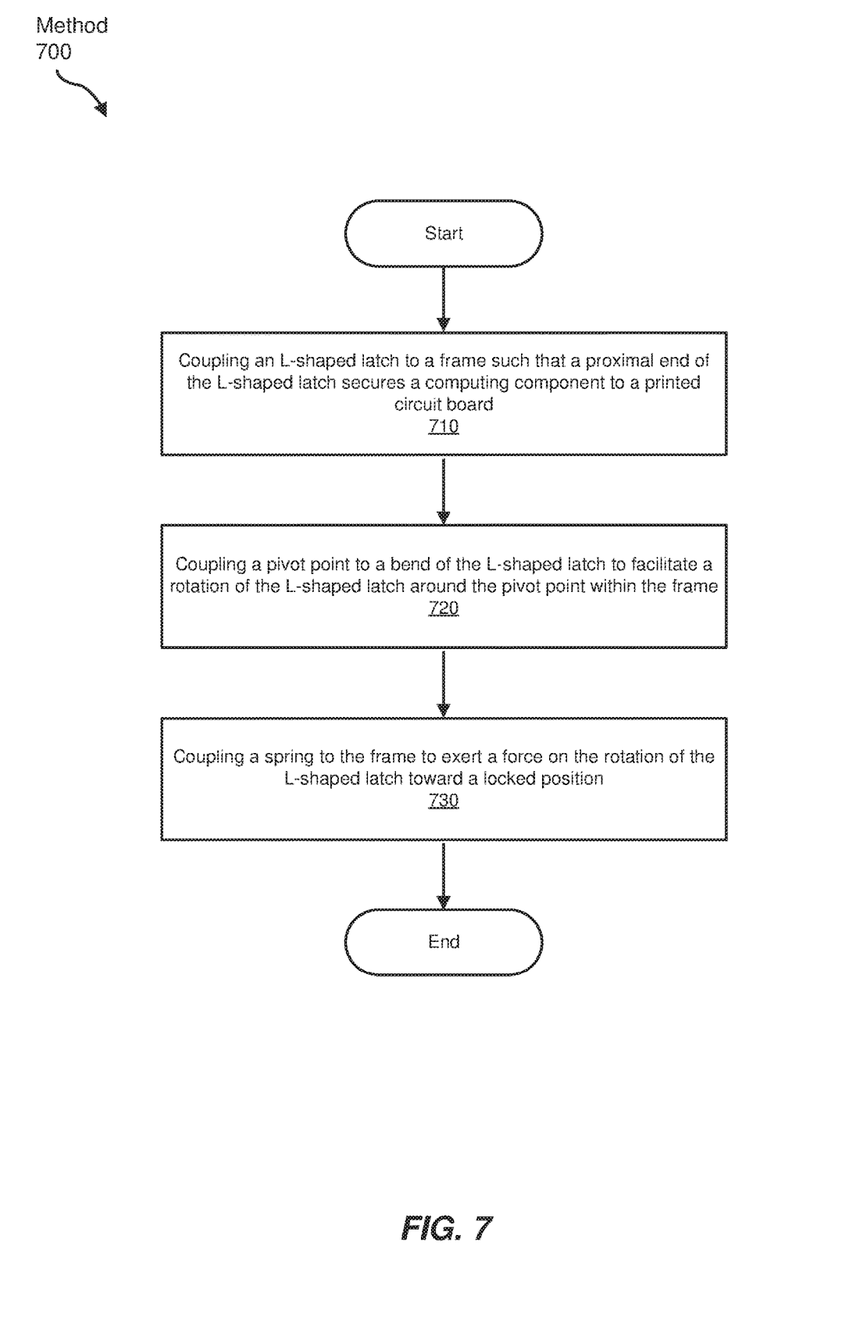
FIG. 7 is a flow diagram of an exemplary method for securing computing components to printed circuit boards.

FIG. 7 shows an example method for manufacturing, assembling, using, adjusting, or otherwise configuring or creating the systems and apparatuses presented herein. The steps shown in FIG. 7 may be performed by any individual and/or by any suitable type or form of manual and/or automated apparatus. In particular, FIG. 7 illustrates a flow diagram of an exemplary method 700 for assembling a latch apparatus.

As shown in FIG. 7, at step 710, an L-shaped latch may be coupled to a frame such that a proximal end of the L-shaped latch secures a computing component to a printed circuit board. For example, as illustrated in FIG. 4, L-shaped latch 102 may be coupled to frame 104 such that proximal end 106 secures computing component 404 to printed circuit board 402. In this example, proximal end 106 may include hook 406 dimensioned to surround a portion of computing component 404 to force computing component 404 toward printed circuit board 402.

At step 720, a pivot point may be coupled to a bend of the L-shaped latch to facilitate a rotation of the L-shaped latch around the pivot point within the frame. For example, as illustrated in FIG. 3, pivot point 108 may be coupled to the bend of L-shaped latch 102. In the example of FIG. 5, pivot point 108 may then be coupled to frame 104 and facilitate the rotation of L-shaped latch 102 within frame 104. In this example, pivot point 108 may be coupled to the bend of L-shaped latch 102 by facilitating the rotation of L-shaped latch 102 such that a downward force on proximal end 106 of L-shaped latch 102 exerts an upward rotation of distal end 202 and a downward force on distal end 202 of L-shaped latch 102 exerts an upward rotation of proximal end 106.

At step 730, a spring may be coupled to the frame to exert a force on the rotation of the L-shaped latch toward a locked position. As shown in FIG. 3, spring 302 may be coupled to frame 104 of FIG. 1 to exert a force on the rotation of L-shaped latch 102 toward the locked position. In this example, spring 302 may be coupled to frame 104 by coupling spring 302 to pin 112 inserted through frame 104 and dimensioning spring 302 to exert a force against protrusion 304 of L-shaped latch 102 to maintain the locked position. Furthermore, in this example, protrusion 304 may be extended from an outer surface of L-shaped latch 102 such that protrusion 304 slides past spring 302 as L-shaped latch 102 rotates around pivot point 108.

As discussed throughout the instant disclosure, the disclosed methods, systems, and apparatuses may provide one or more advantages over traditional methods of securing computing components in data centers. For example, the latch apparatuses described herein may anchor to printed circuit boards in order to secure computing components to the printed circuit boards. As another example, by exerting a steady force on the latch with a spring, the systems described herein may maintain a locked position to prevent a computing component from moving. Additionally, the disclosed latch apparatuses may utilize an L-shape such that force on one end of the L-shape rotates the latch to a locked position while force on the other end of the L-shape rotates the latch to an unlocked position and unseats the computing component. Furthermore, the latch apparatuses described herein may be implemented as part of a chassis in a data-center rack to secure various computing components. Thus, the mechanisms disclosed herein may enable faster and easier mounting or dismounting of computing components in comparison to traditional mechanisms.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A latch apparatus comprising:
   an L-shaped latch coupled to a frame such that a proximal end of the L-shaped latch secures a computing component to a printed circuit board;
   a pivot point coupled to a bend of the L-shaped latch to facilitate a rotation of the L-shaped latch around the pivot point within the frame; and
   a spring coupled to the frame to exert a force on the rotation of the L-shaped latch toward a locked position by exerting a force against a protrusion of the L-shaped latch to maintain the locked position of the L-shaped latch.

2. The latch apparatus of claim 1, wherein the frame at least:
   is coupled to the printed circuit board by an anchor; or
   comprises a protruding part of the printed circuit board.

3. The latch apparatus of claim 1, wherein the proximal end of the L-shaped latch comprises a hook that surrounds a portion of the computing component to force the computing component toward the printed circuit board.

4. The latch apparatus of claim 1, wherein the pivot point facilitates the rotation of the L-shaped latch such that:
   a position of the pivot point prohibits an unintentional rotation of the L-shaped latch;
   a downward force on the proximal end of the L-shaped latch exerts an upward rotation of a distal end of the L-shaped latch; and
   a downward force on the distal end of the L-shaped latch exerts an upward rotation of the proximal end of the L-shaped latch.

5. The latch apparatus of claim 4, wherein the downward force on the proximal end of the L-shaped latch rotates the distal end of the L-shaped latch to exert a force upward to lift the computing component away from the printed circuit board.

6. The latch apparatus of claim 4, wherein a downward force applied to the computing component toward the distal end of the L-shaped latch locks the L-shaped latch.

7. The latch apparatus of claim 1, wherein the spring is coupled to a pin inserted through the frame.

8. The latch apparatus of claim 1, wherein the protrusion is extended from an outer surface of the L-shaped latch such that the protrusion slides past the spring as the L-shaped latch rotates around the pivot point.

9. A data-center rack comprising:
   a rack dimensioned to hold computer hardware;
   at least one chassis coupled to the rack that contains at least one printed circuit board;
   at least one computing component coupled to the printed circuit board; and
   at least one latch apparatus, comprising an L-shaped latch and a spring exerting a force against a protrusion of the L-shaped latch to maintain a locked position of the latch apparatus, coupled to the printed circuit board to secure the computing component to the printed circuit board.

10. The data-center rack of claim 9, wherein the chassis is dimensioned to slide perpendicular to a face of the rack such that the chassis extends away from the rack to expose the printed circuit board.

11. The data-center rack of claim 9, wherein the latch apparatus comprises:
    a frame;
    the L-shaped latch coupled to the frame;
    a pivot point coupled to a bend of the L-shaped latch; and
    the spring coupled to the frame.

12. The data-center rack of claim 11, wherein a proximal end of the L-shaped latch surrounds a portion of the computing component to force the computing component toward the chassis.

13. The data-center rack of claim 12, wherein the pivot point facilitates a rotation of the L-shaped latch such that:
    a position of the pivot point prohibits an unintentional rotation of the L-shaped latch;
    a downward force on the proximal end of the L-shaped latch rotates a distal end of the L-shaped latch to exert a force upward to lift the computing component away from the chassis; and
    a downward force applied to the computing component toward the distal end of the L-shaped latch rotates the L-shaped latch toward the locked position.

14. The data-center rack of claim 11, wherein the spring:
    is coupled to a pin inserted through the frame; and
    exerts a force against a protrusion of the L-shaped latch to prevent a rotation of the L-shaped latch.

15. The data-center rack of claim 14, wherein the protrusion is extended from an outer surface of the L-shaped latch such that the protrusion slides past the spring as the L-shaped latch rotates around the pivot point.

16. A method comprising:
    coupling an L-shaped latch to a frame such that a proximal end of the L-shaped latch secures a computing component to a printed circuit board;
    coupling a pivot point to a bend of the L-shaped latch to facilitate a rotation of the L-shaped latch around the pivot point within the frame; and
    coupling a spring to the frame to exert a force on the rotation of the L-shaped latch toward a locked position by dimensioning the spring to exert a force against a protrusion of the L-shaped latch to maintain the locked position of the L-shaped latch.

17. The method of claim 16, wherein the proximal end of the L-shaped latch comprises a hook that surrounds a portion of the computing component to force the computing component toward the printed circuit board.

18. The method of claim 16, wherein coupling the pivot point, to the bend of the L-shaped latch comprises facilitating the rotation of the L-shaped latch such that:
    a position of the pivot point prohibits an unintentional rotation of the L-shaped latch;
    a downward force on the proximal end of the L-shaped latch exerts an upward rotation of a distal end of the L-shaped latch; and
    a downward force on the distal end of the L-shaped latch exerts an upward rotation of the proximal end of the L-shaped latch.

19. The method of claim 16, wherein coupling the spring to the frame comprises coupling the spring to a pin inserted through the frame.

20. The method of claim 16, further comprising extending the protrusion from an outer surface of the L-shaped latch such that the protrusion slides past the spring as the L-shaped latch rotates around the pivot point.

* * * * *

UNITED STATES PATENT AND TRADEMARK OFFICE
CERTIFICATE OF CORRECTION

PATENT NO. : 10,178,791 B1
APPLICATION NO. : 15/713607
DATED : January 8, 2019
INVENTOR(S) : Chuankeat Kho Page 1 of 1

It is certified that error appears in the above-identified patent and that said Letters Patent is hereby corrected as shown below:

In the Claims

In Column 10, Line 44, Claim 18, delete "point," and insert -- point --, therefor.

Signed and Sealed this
Twenty-sixth Day of March, 2019

Andrei Iancu
*Director of the United States Patent and Trademark Office*